(12) United States Patent
Tanzawa (10) Patent No.: US 9,330,789 B2
(45) Date of Patent: *May 3, 2016

(54) SHORT-CHECKING METHODS

(71) Applicant: MICRON TECHNOLOGY, INC., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/828,662

(22) Filed: Aug. 18, 2015

(65) Prior Publication Data

US 2015/0357049 A1 Dec. 10, 2015

Related U.S. Application Data

(63) Continuation of application No. 13/922,378, filed on Jun. 20, 2013, now Pat. No. 9,136,017.

(51) Int. Cl.
| | |
|---|---|
| G11C 29/00 | (2006.01) |
| G11C 29/50 | (2006.01) |
| G11C 16/26 | (2006.01) |
| G11C 16/14 | (2006.01) |
| G11C 29/08 | (2006.01) |
| G01R 31/02 | (2006.01) |
| G11C 16/04 | (2006.01) |
| G11C 29/02 | (2006.01) |
| G11C 29/12 | (2006.01) |

(52) U.S. Cl.
CPC ............. *G11C 29/50* (2013.01); *G01R 31/025* (2013.01); *G11C 16/0483* (2013.01); *G11C 16/14* (2013.01); *G11C 16/26* (2013.01); *G11C 29/025* (2013.01); *G11C 29/08* (2013.01); *G11C 2029/1202* (2013.01); *G11C 2029/1204* (2013.01); *G11C 2029/5004* (2013.01)

(58) Field of Classification Search
CPC ...... G11C 29/08; G11C 29/50; G11C 29/025; G11C 16/0483; G11C 16/14; G11C 16/26; G11C 2029/1202; G11C 2029/1204; G11C 2029/5004; G01R 31/025
USPC ........... 365/201, 185.02, 185.04, 185.09, 200
See application file for complete search history.

(56) References Cited

U.S. PATENT DOCUMENTS

| | | | |
|---|---|---|---|
| 5,392,248 A | 2/1995 | Truong et al. | |
| 5,548,557 A * | 8/1996 | Futatsuya | G11C 16/08 365/185.09 |
| 5,606,527 A | 2/1997 | Kwack et al. | |
| 5,748,545 A | 5/1998 | Lee et al. | |
| 6,304,504 B1 * | 10/2001 | Chevallier | G11C 29/50 365/185.09 |
| 6,765,827 B1 | 7/2004 | Li et al. | |
| 6,781,897 B2 | 8/2004 | Dvir et al. | |
| 7,499,355 B2 * | 3/2009 | Scheuerlein | G11C 5/145 365/201 |
| 7,649,790 B2 | 1/2010 | Teramoto et al. | |

\* cited by examiner

*Primary Examiner* — Tan T Nguyen (74) *Attorney, Agent, or Firm* — Dicke, Billig & Czaja, PLLC (57) ABSTRACT

In an embodiment, a short-checking method includes charging a data line to an initial voltage while activating a memory cell coupled to the data line, allowing the data line to float while continuing to activate the memory cell, sensing a resulting voltage on the data line after a certain time, and determining whether a short exists in response to a level of the resulting voltage.

23 Claims, 4 Drawing Sheets

SHORT-CHECKING METHODS

RELATED APPLICATION

This application is a continuation of U.S. patent application Ser. No. 13/922,378, filed Jun. 20, 2013 and issued as U.S. Pat. No. 9,136,017 on Sep. 15, 2015, which is commonly assigned and incorporated in its entirety herein by reference.

FIELD

The present disclosure relates to short-checking methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the cells, through programming (which is sometimes referred to as writing) of charge-storage structures (e.g., floating gates or charge traps) or other physical phenomena (e.g., phase change or polarization), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select transistors, e.g., a source select transistor and a drain select transistor. Each source select transistor is connected to a source line, while each drain select transistor is connected to a data line, such as column bit line. A "column" refers to a group of memory cells that are commonly coupled to a local data line, such as a local bit line. It does not require any particular orientation or linear relationship, but instead refers to the logical relationship between memory cell and data line.

Memory cells (e.g., a series-coupled string of memory cells) might be adjacent to a semiconductor. For example, during operation of one or more memory cells, such as a string of memory cells, a channel can be formed in the semiconductor. However, shorts can occur between an access line and the semiconductor.

For the reasons stated above, and for other reasons stated below which will become apparent to those skilled in the art upon reading and understanding the present specification, there is a need in the art for identifying shorts in memory arrays.

DETAILED DESCRIPTION

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

Figure 1A:
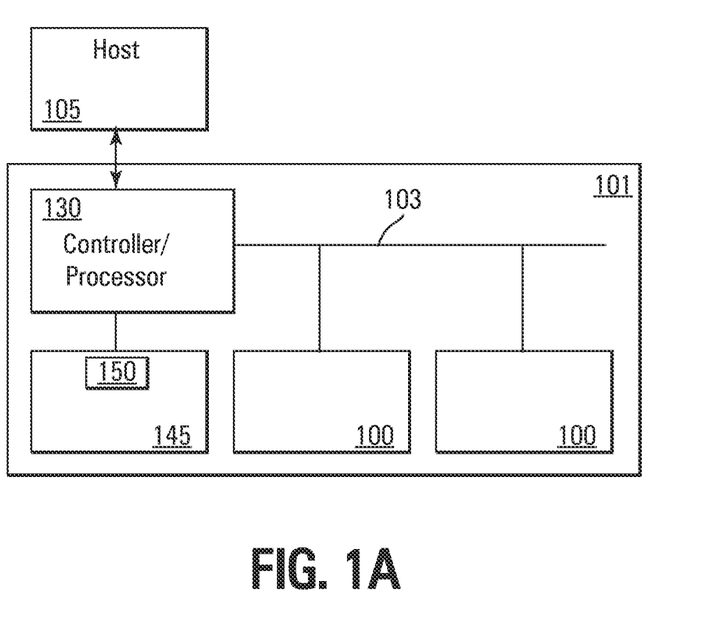
FIG. 1A is a simplified block diagram of a memory system, according to an embodiment.

FIG. 1A is a simplified block diagram of an electronic system, such as a memory system (e.g., a storage system 101), that might include a controller 130, such as a memory controller. Controller 130 might include a processor, for example. An interface, such as a bus 103, e.g., containing address, data, and control lines, may couple controller 130 to one or more integrated circuit devices, such as one or more memory devices 100. For some embodiments, a volatile memory 145 (e.g., a volatile register, RAM, etc.) might be external to controller 130 and coupled to controller 130. Alternatively, volatile memory 145 might be internal to controller 130, as shown in FIG. 1B.

Controller 130 might be coupled to a host 105. Memory controller 130 may receive command signals (or commands), address signals (or addresses), and data signals (or data) from the host 105 and may output data to the host 105. For some embodiments, host 105 may be a portion of a tester, and storage system 101 might be a system under test. For example, controller 130 might include a test mode that activates a test mode in one or more of memory devices 100 in response to commands from the host 105.

Figure 1B:
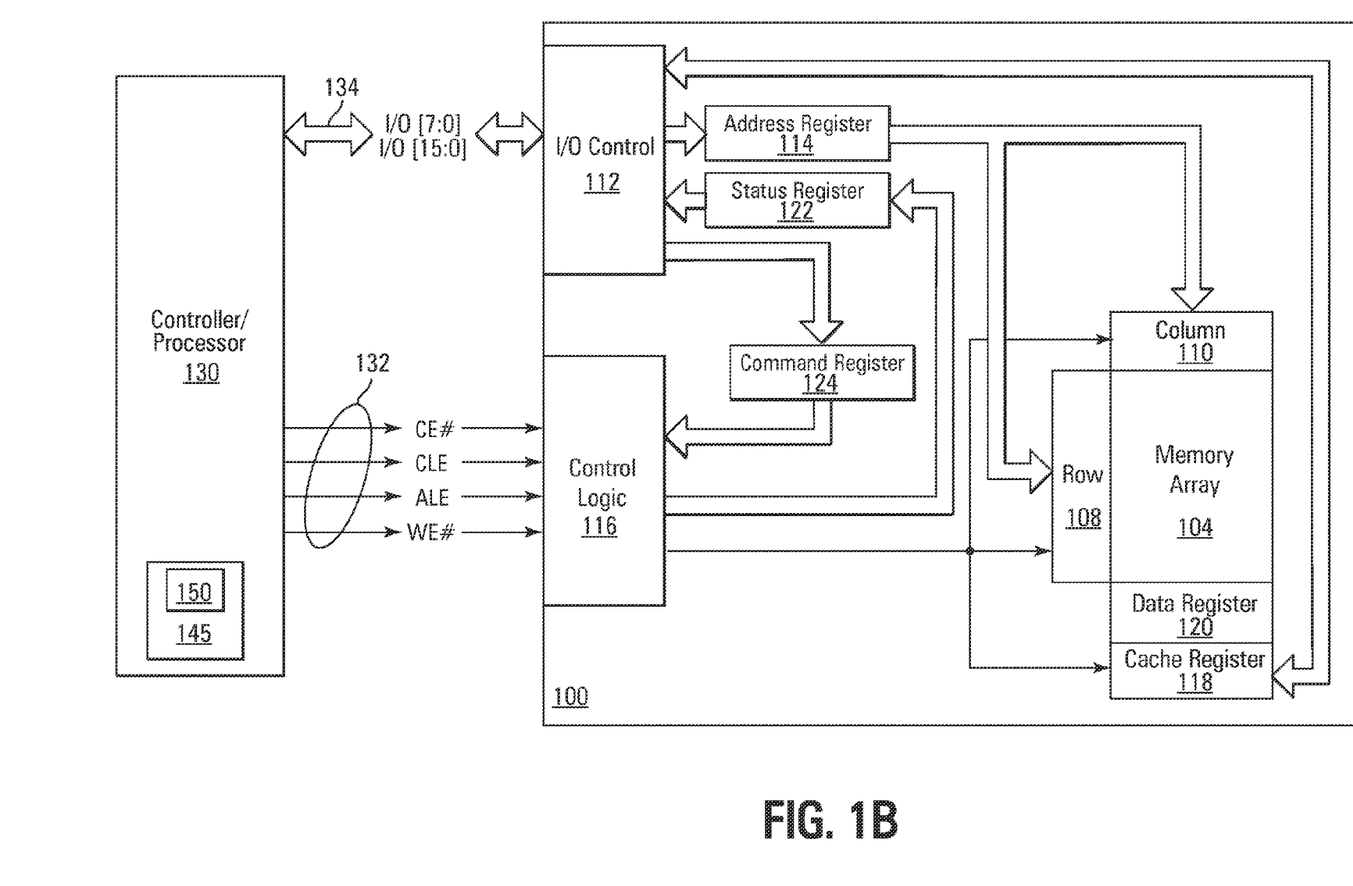
FIG. 1B is a simplified block diagram of a memory system, according to another embodiment.

FIG. 1B is a simplified block diagram of a portion of storage system 101, providing additional detail of a memory device 100, such as a NAND flash memory device, in communication with controller 130, according to an embodiment.

Memory device 100 includes an array of memory cells 104. Memory array 104 may be a quasi-two-dimensional (e.g.

"two-dimensional") array. For example, a quasi-two-dimensional array might include memory cells (e.g., series-coupled strings of memory cells) over a surface of a semiconductor, where the surface of the semiconductor lies substantially in a single plane. For example, an array may be considered to be quasi-two dimensional when the memory cells are formed in substantially a single plane, such as a substantially horizontal plane, over a semiconductor, e.g., a planar semiconductor.

As another example, memory array 104 may be a stacked memory array, e.g., often referred to as three-dimensional memory array. For example, one type of three-dimensional memory array might include a plurality of stacked quasi-two-dimensional arrays. Another type of three-dimensional memory array might include pillars of stacked memory elements, such as vertical series-coupled strings of memory cells, e.g., NAND strings. For example, a pillar might be a semiconductor and a plurality of memory cells (e.g., a series-coupled string of memory cells) might be adjacent to the pillar.

A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and a controller, e.g., that may include control logic 116, to latch incoming commands. Control logic 116 controls access to the memory array 104 in response to the commands and generates status information for the external controller 130. The control logic 116 is in communication with row decoder 108 and column decoder 110 to control the row decoder 108 and column decoder 110 in response to the addresses.

A controller can include control logic, such as control logic 116, other circuitry, firmware, software, or the like, whether alone or in combination, and can be an external controller (e.g., in a separate die from the memory array, whether wholly or in part) or an internal controller, such as a controller including control logic 116 (e.g., included in a same die as the memory array).

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external controller 130; then new data is passed from the data register 120 to the cache register 118. A status register 122 is in communication with I/O control circuitry 112 and control logic 116 to latch the status information for output to the controller 130.

For some embodiments, the status information might include information about whether a block of memory cells of memory array 104 is a defective (e.g., a failed) block. For example, a block may be designated as a failed block if it is determined, e.g., using one or more of the short-checking methods disclosed herein, that the block includes a short.

Memory device 100 receives control signals at control logic 116 from controller 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from controller 130 over a multiplexed input/output (I/O) bus 134 and outputs data to controller 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Control logic 116 may include a test mode that may be activated and deactivated in response to receiving test-mode-activation and test-mode-deactivation signals from controller 130, for example when controller 130 is placed in a test mode in response to receiving a command from a tester. Control logic 116 may be configured to cause memory device 100 to perform short-checking methods during normal operation of device 100, such as during erase operations, and/or during the test mode.

For example, a short-checking method might include charging a data line to an initial voltage while activating a memory cell coupled to the data line, allowing the data line to float while continuing to activate the memory cell, sensing a resulting voltage on the data line after a certain time, and determining whether the resulting voltage indicates that a short exists. Although a data line would not truly be floating if a short existed in a memory cell coupled to that data line, as used herein a data line will be deemed to be floating if it isolated from conducting nodes within its designed circuit path.

In another example, a short-checking method might include activating a string of memory cells, activating a select transistor between the string of memory cells and a data line to couple the string of memory cells to the data line, charging the data line to an initial voltage (e.g., with a sense amplifier in response to activating a transistor between the data line and the sense amplifier), floating the data line (e.g., in response to deactivating the transistor between the data line and the sense amplifier) while continuing to activate the string of memory cells, sensing a resulting voltage on the data line with the sense amplifier (e.g., in response to reactivating the transistor between the data line and the sense amplifier) after a certain time has elapsed, and determining whether the resulting voltage indicates that a short exists.

It will be appreciated by those skilled in the art that additional circuitry and signals can be provided, and that the memory device of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B.

Additionally, while specific I/O pins are described in accordance with popular conventions for receipt and output of the various signals, it is noted that other combinations or numbers of I/O pins may be used in the various embodiments.

Figure 2:
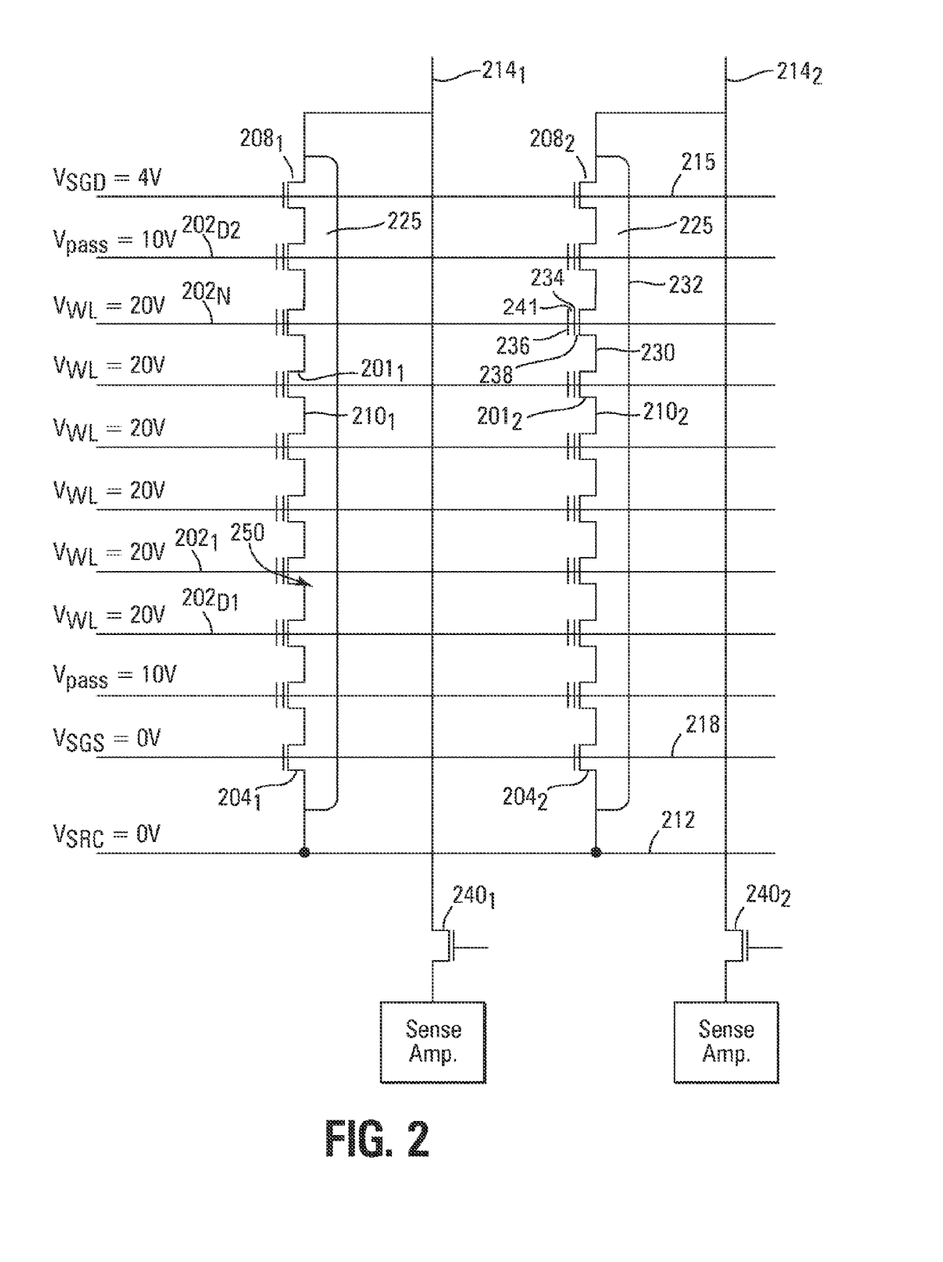
FIG. 2 illustrates a schematic representation of a portion of a memory array, according to another embodiment.

FIG. 2 illustrates a schematic diagram of a portion of a memory array, such as a portion of memory array 104 in FIG. 1B. For example, the memory array portion in FIG. 2 might be a portion of a memory block of memory array 104. The array may include a plurality of memory cells 201, such as non-volatile memory cells, between a select transistor 204, such as a source select transistor, and a select transistor 208, such as a drain select transistor.

For example, a series-coupled string $210_1$ of memory cells $201_1$, coupled source to drain, might be between and in series with select transistor $204_1$ and select transistor $208_1$, where select transistor $204_1$ selectively couples string $210_1$ to a source 212 and select transistor $208_1$ selectively couples string $210_1$ to a data line, e.g., bit line $214_1$. A series-coupled string $210_2$ of memory cells $201_2$, coupled source to drain, might be between and in series with select transistor $204_2$ and select transistor $208_2$, for example, where select transistor $204_2$ selectively couples string $210_2$ to the source 212 and select transistor $208_2$ selectively couples string $210_2$ to another data line, e.g., bit line $214_2$. While the subsequent discussions predominately refer to NAND memory devices, the present embodiments are not limited to NAND memory devices, but can be used in other memory devices as well.

Select transistors $208_1$ and $208_2$ might have control gates commonly coupled to a select line 215, such as a drain select line, while select transistors $204_1$ and $204_2$ might have control gates commonly coupled to a select line 218, such as a source select line. The memory cells 201 in each of strings 210 may have control gates respectively coupled to access lines, such as word lines $202_{D1}$, $202_1$ to $202_N$, and $202_{D2}$. For example, word lines $202_{D1}$ and $202_{D2}$ might be "dummy" word lines and the memory cells 201 coupled to word lines $202_{D1}$ and $202_{D2}$ might be "dummy" memory cells in a string 210, e.g., that are not used for data storage. For some embodiments, the memory cells 201 commonly coupled to a word line might be referred to as a row of memory cells, while those memory cells, such as a string 210 of memory cells, coupled to a bit line might be referred to as a column of memory cells.

Bit lines $214_1$ and $214_2$ might be respectively coupled to transistors $240_1$ and $240_2$. Transistors $240_1$ and $240_2$ respectively selectively couple bit lines $214_1$ and $214_2$ to sense amplifiers and circuitry for charging bit lines $214_1$ and $214_2$. For example, transistors $240_1$ and $240_2$ might be respectively between bit lines $214_1$ and $214_2$ and the sense amplifiers. For some embodiments, the bit lines $214_1$ and $214_2$ may be selectively coupled to the same sense amplifier, and transistors $240_1$ and $240_2$ may be transistors within a multiplexer.

For some embodiments, memory cells 201 (e.g., the strings 210 of memory cells 201) might be adjacent to (e.g., over) a semiconductor 225. Semiconductor 225 might be comprised of silicon that might be conductively doped to have a p-type conductivity or an n-type conductivity, for example.

The memory array in FIG. 2 might be a quasi-two-dimensional memory array and semiconductor 225 might have a planar structure, e.g., having an upper surface that lies in substantially a single plane. For example, in the semiconductors 225 adjacent to strings $210_1$ and $210_2$ might be portions (e.g., contiguous portions) of the same planar semiconductor structure. Alternatively, the memory array in FIG. 2 might be a three-dimensional memory array, where the semiconductors 225, e.g., respectively adjacent to strings $210_1$ and $210_2$, might be semiconductor pillars, e.g., individual semiconductor pillars.

Typical construction of a memory cell 201 includes a source 230 and a drain 232, a charge-storage structure 234 (e.g., a floating gate, charge trap, etc.) that can store a charge that determines a data value of the cell, and a control gate 236. The control gates 236 might be coupled to (and in some cases might form a portion of) a word line 202.

A dielectric 238, such as a tunnel dielectric (e.g. tunnel oxide), might be between the charge-storage structure 234 of a memory cell 201 and semiconductor 225. A dielectric 241, such as a blocking dielectric, might be between the charge-storage structure 234 and the control gate 236 of the memory cell.

Memory cells 201 may be programmed using program/erase cycles, e.g., where such a cycle might involve first erasing a memory cell 201 and then programming the memory cell 201. For a NAND array, a block of memory cells (e.g., that might include strings $210_1$ and $210_2$) might be erased by grounding all of the word lines 202 in the block and applying an erase voltage to the semiconductor 225, and thus to the channels of the memory cells 201, to remove the charge from the charge-storage structures.

Shorts can occur between a control gate 236, and thus a word line 202, and semiconductor 225. Shorts can result in failed bits during program and read operations and can result in uncorrectable bit code error rates.

The shorts might be due to defects in dielectric 238 and/or dielectric 241. For example, such defects might occur during manufacturing. The defects could also be caused by the breakdown of dielectric 238 and/or dielectric 241 as the result of a number of program/erase cycles performed on the memory cells. For example, the likelihood of a short between a word line and the semiconductor may increase as the number of program/erase cycles increase.

As one example, charge carriers (e.g., holes) may build up in the dielectric 238 of a memory cell 201 after some number of program/erase cycles, which may electrically short the charge-storage structure 234 to the semiconductor 225, resulting in a bit failure of that memory cell 201. As program/erase cycles continue, that defect can then cause the word line 202 of the memory cell 201 to short to the semiconductor 225, resulting in failure of each memory cell 201 coupled to that word line 202 as that word line 202 may no longer be able to reach suitable program voltages.

Control logic 116 (FIG. 1B), and thus memory device 100, is configured to perform short-checking methods to determine whether shorts occur in the memory array in FIG. 2 and thus in memory array 104 of memory device 100. For example, a short-checking method might be performed during normal operation of memory device 100, such as during an erase operation (e.g., an erase algorithm), or during a test mode of control logic 116, and thus of memory device 100. For example, a short-checking method might determine whether there is a short between a word line and a semiconductor, such as a planar semiconductor, e.g., over which one or more strings of memory cells are formed, or a word line and a semiconductor pillar, e.g., adjacent to which a string of memory cells is formed.

For example, an erase operation might include, e.g., in order, a preprogramming portion (e.g., cycle), an erase portion (e.g., cycle), and a soft-programming portion (e.g., cycle). The preprogramming portion of the erase operation puts the memory cells in a programmed state by applying a preprogramming voltage, e.g., that may be less than a typical programming voltage applied during a typical programming algorithm, to each of the word lines followed by a preprogramming verify. The erase portion might involve applying an erase voltage, e.g., to a semiconductor while the word lines are grounded, followed by an erase verify. The soft-programming portion (e.g., heal portion) corrects any over-erased memory cells after the erase portion has been completed by applying a soft programming voltage to the word lines coupled to over-erased memory cells, followed by a soft-programming verify. For example, soft programming may be referred to as compaction.

For some embodiments, a short-checking method might be performed as part of the erase operation after the erase portion (e.g., after the erase verify of the erase portion of the erase operation). For example, if no shorts are determined (e.g., indicated) during the short-checking method, the soft-programming portion of the erase operation might be performed after the short-checking method in response to the short-checking method determining no shorts.

In some embodiments, the erase operation might include another erase verify that might be performed after the soft-programming portion. However, if the short-checking method indicates a short, a failure (e.g., an erase failure) might be indicated, and the erase operation may be terminated in response to the short-checking method indicating a short, before performing the soft-programming portion. For example, if a short is indicated, an erase failure is indicated for the memory cells (e.g., the block of memory cells) being erased. For example, the memory cells being erased might be tagged as "bad," e.g., a block might be tagged as a "bad block," and the memory cells (e.g., block) may be removed from use in response to an indication of a short.

FIG. 2 shows an example of the biasing of the word lines 202, and thus the control gates 236 of the memory cells 201 coupled thereto, the select lines 215 and 218, and thus the select transistors 208 and 204 respectively coupled thereto, and the source 212 during an example of a short-checking method. For example, the word lines 202 might be biased so that the memory cells coupled thereto are activated, e.g., so that the all of the memory cells 201 in the strings 210, and thus the strings 210, are activated. Select line 215 might be biased so that the select transistors 208 are activated to couple the strings 210 to the bit lines 214, and select line 218 might be biased so that the select transistors 204 are deactivated to isolate the bit lines 214 from the source 212. The memory cells 201 might be activated for determining whether a short exists between any of the word lines $202_{D1}$, $202_1$ to $202_N$, and $202_{D2}$ (e.g., between control gates 236 of the memory cells 201 coupled to those word lines) and semiconductor 225.

For some embodiments, all of the odd-numbered bit lines, including bit line $214_1$, and thus the odd-numbered strings, including string $210_1$, might be selected for short testing, while all of the even-numbered bit lines, including bit line $214_2$, and thus the even-numbered strings, including string $210_2$, might be deselected for short testing, e.g., by grounding the even-numbered bit lines. Then, all of the even-numbered bit lines, including bit line $214_2$, and thus the even-numbered strings, including string $210_2$, might be selected for short testing, while all of the odd-numbered bit lines, including bit line $214_1$, and thus the odd-numbered strings, including string $210_1$, might be deselected for short testing, e.g., by grounding the odd-numbered bit lines.

Each the word lines $202_1$ to $202_N$ might be biased to a voltage $V_{WL}$, e.g., of about 20V, that may be sufficient to activate (e.g., to turn on) the memory cells coupled word lines $202_1$ to $202_N$ so that these memory cells can pass current. For example, the voltage $V_{WL}$ might be about a preprogramming voltage that might be applied to word lines during a preprogramming portion of an erase operation or a soft-programming voltage that might be applied to the word lines during a soft-programming portion of the erase operation. For example, the voltage $V_{WL}$ might be sufficient to change the threshold voltage of a memory cell from an erased state to a programmed state.

"Dummy" word lines $202_{D1}$ and $202_{D2}$ might be biased to a pass voltage $V_{pass}$, e.g., of about 10V, e.g., that might be less than the voltage $V_{WL}$, that is sufficient to activate (e.g., to turn on) the "dummy" memory cells coupled to word lines $202_{D1}$ and $202_{D2}$ so that the "dummy" memory cells can pass current. Select line 215 might be biased to a voltage $V_{SGD}$, e.g., of about 4V, sufficient to activate select transistor $208_1$. Activating select transistor $208_1$ couples string $210_1$ to bit line $214_1$. Select line 218 might be biased to a voltage $V_{SGS}$, e.g., of about 0V, so that select transistors 204 are deactivated, and source 212 might be biased to a voltage $V_{SRC}$, e.g., of about 0V.

A short-checking method might include, charging (pre-charging) bit line $214_1$ to an initial (e.g., a pre-charge) voltage, e.g., of about 0.5V. For example, while the word lines 202, the select lines 215 and 218, and the source 212 are biased, e.g., as shown in FIG. 2, and while bit line $214_2$, e.g., and other odd bit lines of the block, are grounded, bit line $214_1$ may be charged to the first voltage in response to activating transistor $240_1$. For example, activating transistor $240_1$ might couple bit line $214_1$ to charging circuitry that might be part of the sense amplifier. Where a short-checking method might be performed as part of the erase operation, bit line $214_1$ might be charged after an erase portion of the erase operation is performed, for example.

After bit line $214_1$ is charged to the initial voltage, transistor $240_1$ is deactivated, and bit line $214_1$ is allowed to float during the short-checking method while continuing to activate the memory cells 201 coupled to the bit line $214_1$. For example, transistor $240_1$ might be deactivated for a certain time (e.g., about 100 microseconds) to isolate the bit line $214_1$ from its corresponding sense amplifier. As a result, the bit line $214_1$ is deemed floating as it is isolated from conducting nodes within its designed circuit path, e.g., between its corresponding sense amplifier and the source 212. After the certain time has elapsed, transistor $240_1$, may be reactivated, during the short-checking method, to couple bit line $214_1$ to the sense amplifier that is configured to sense the voltage (e.g., a resulting voltage) on bit line $214_1$ and to compare the level of the sensed voltage to a certain level, e.g., that may be greater than the level of the initial voltage. For example, bit line $214_1$ might be sensed after bit line $214_1$ has floated for the certain time in response to reactivating transistor $240_1$.

A level of a voltage on bit line $214_1$ that is greater than the certain level, for example, may be indicative of a short, and a level of a voltage on bit line $214_1$ that is less than or equal to the certain level may be indicative of no short, e.g., when the memory cells of a string 210 are activated by a voltage that is greater than the initial voltage. For example, control logic 116 might be configured to assign a first data value (e.g., a zero (0)) to bit line $214_1$ that is indicative of a failure (e.g., a short) in response to a level of the resulting voltage on bit line $214_1$ being greater than the certain voltage and to assign a second data value (e.g., a one (1)) to bit line $214_1$ that is indicative of a pass (e.g., no short) in response to the resulting voltage on bit line $214_1$ being less than or equal to the certain voltage. It is noted that a normal read operation on a memory cell 201 coupled to the bit line $214_1$ might sense for a resulting voltage of the bit line $214_1$ having an opposite change than in the short-checking method. For example, where the short-checking method may sense for a resulting voltage higher than the pre-charge voltage, a normal read operation may sense for a resulting voltage lower than the pre-charge voltage.

Control logic 116 may tag the memory cells coupled to a bit line during the short-checking method and having the first data value as failed (e.g., "bad") memory cells, where the "bad" memory cells are no longer used. For example, control logic 116 might tag a block of memory cells having one or more bit lines with the first data value as a "bad" block, where the "bad" block would no longer be used for storing data.

For some embodiments, control logic 116 might assign a first data value, such as a logic zero, to a block that has a short to indicate that the block failed the short check and a second data value, such as a logic one, to indicate that a block without a short passed the short check. For example, control logic 116 might cause the first or second value to be written to (e.g., stored in) status register 122. Controller 130 may then read the value in status register 122, for example. Alternatively, I/O control circuitry 112 and/or control logic 116 might send the value to controller 130.

For some embodiments, bit line $214_1$, the word lines $202_{D1}$, $202_1$ to $202_N$, and $202_{D2}$, and select line 215 might be discharged after determining whether a short exists. For example, the bias voltages might be removed from word lines $202_{D1}$, $202_1$ to $202_N$, and $202_{D2}$ and select line 215 after determining whether a short exists.

Note that bit line $214_1$ might represent an odd-numbered bit line, e.g., in a block. For example, all of the odd-numbered bit lines might be pre-charged, floated, and sensed substantially concurrently to determine whether any odd bit lines indicate a short. The odd-numbered bit lines, including bit line $214_1$, of the block might be grounded, while the even bit lines, including bit line $214_2$, of the block are pre-charged, floated, and sensed substantially concurrently to determine whether any even bit lines indicate a short. For other embodiments, the odd- and even-numbered bit lines may pre-charged, floated, and sensed substantially concurrently.

For embodiments where a short-checking method might be performed as part of an erase operation, the erase operation might be terminated in response to determining (e.g., an indication of) a short. However, the erase operation might proceed to a soft-programming portion of the erase operation in response to there being no shorts, e.g., in response to the memory cells (e.g., a block) passing a short-checking method.

For some embodiments, a short-checking method might be performed on a memory cell (e.g., a block of memory cells), e.g., as part of an erase operation or a test mode, in response to a certain number of program/erase cycles (e.g., 1000 program/erase cycles) being performed on the memory cell (e.g., the block of memory cells).

Note that while bit line $214_1$ is floating in the presence of a short between a word line, such as word line $202_1$, and thus the control gate coupled to that word line, and semiconductor 225, as indicated by arrow 250 in FIG. 2, current can flow from the word line into substrate 225. The current can then flow through the memory cells 201, e.g., through string $210_1$, through the activated select transistor $208_1$, and into the floating bit line $214_1$. This can act to increase the voltage on bit line $214_1$ while transistor $240_1$ is deactivated. Although the foregoing examples describe a certain increase in voltage of a bit line 214 in response to a short between the substrate 225 and a word line 202, other embodiments could lead to a certain decrease in voltage of a bit line 214 in response to a short between the substrate 225 and a word line 202, e.g., where the activation voltage of the memory cells 201 (i.e., voltage applied to word lines 202) is less than the initial (e.g., pre-charge) voltage of the bit line 214, such as could be used in p-type memory cells formed over an n-type semiconductor. For example, a level of a voltage of a bit line 214 that is below a certain level that is less than the initial voltage might indicate a short.

Figure 3:
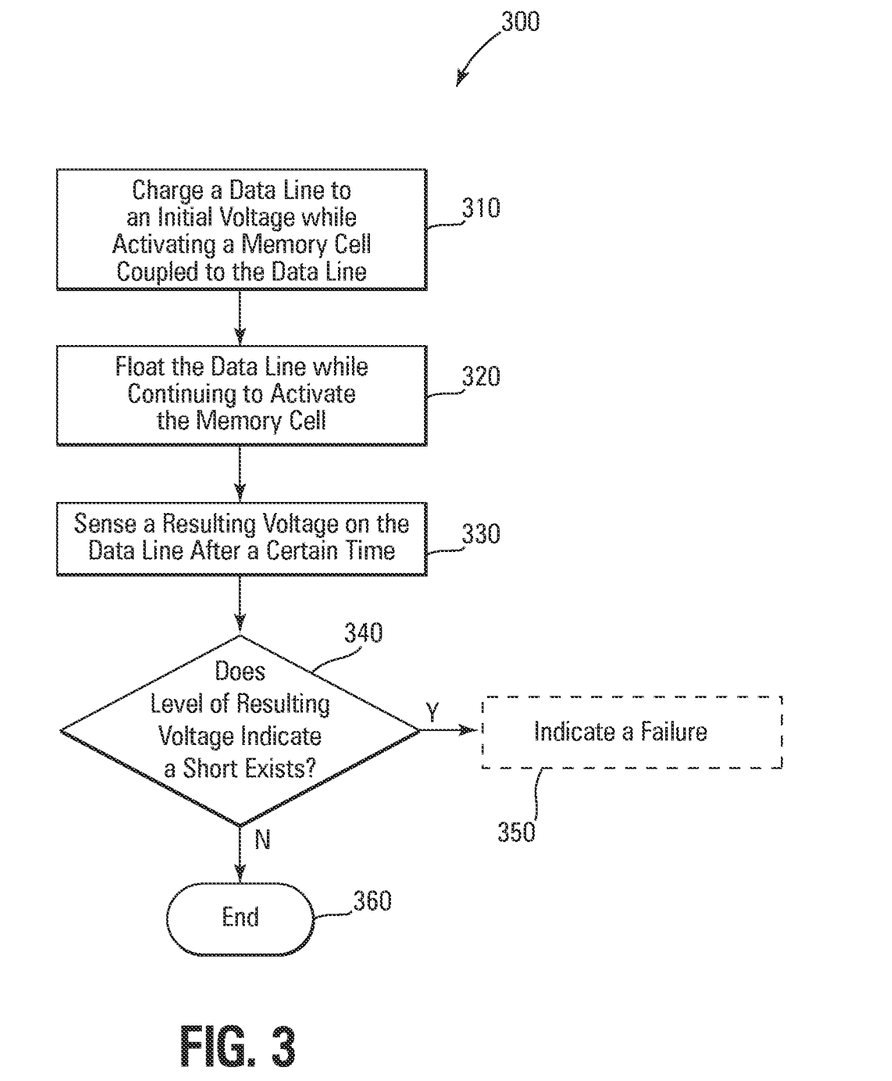
FIG. 3 is a flowchart of a method, according to another embodiment.

FIG. 3 is a flowchart of a method 300, such as a short-checking method. For example, control logic 116 may be configured to cause memory device 100 to perform method 300 during normal operation of device 100, such as during erase operations, and/or during the test mode.

A data line might be charged to an initial voltage while activating a memory cell coupled to the data line at block 310 in method 300. At block 320, the data line may then be floated while continuing to activate the memory cell. A resulting voltage on the data line may then be sensed after a certain time at block 330. The method may then determine whether a short exists at decision block 340, e.g., in response to a level of the resulting voltage. If a short exists, a failure may be indicated at block 350. If a short does not exist, the method might end at block 360.

For some embodiments, a memory device 100 might perform a short-checking method on a block of memory cells, such as method 300, in response to control logic 116 receiving a command from controller 130, e.g., that might address the block. After the short-checking method is performed for a block, e.g., addressed by the command, control logic 116 may send an indication of the status of the block, e.g., whether the block passed or failed the short check, to status register 122. For example, if any data line in the block indicates a short then an indication that the block has failed is sent to status register 122, or if no data line in the block indicates a short, then an indication that the block has passed is sent to status register 122. For example, a first data value (e.g., a logic zero) may be sent to status register 122 to indicate a failure, or a second data value (e.g., a logic one) may be sent to status register 122 to indicate a pass.

The status of the block (e.g., whether the block passed or failed) is then sent (e.g., latched) from status register 122 to controller 130. For example, controller 130 might read the status from status register 122. For some embodiments, controller 130 might remove a failed block from use in response to receiving an indication that the block has failed. For example, controller 130 might store a table of failed blocks (e.g., a table of the addresses, e.g., the physical block addresses, of the failed blocks) in volatile memory 145, and controller 130 might add a failed block to the table in response to receiving an indication that the block has failed a short check.

For some embodiments, volatile memory 145 might include an address table 150 that assigns logical block addresses (LBAs) to physical block addresses (PBAs) (e.g., the locations) of the blocks in memory array 104. For example, controller 130 might update address table 150 by assigning an LBA to a PBA of another block (e.g., a spare block) in memory array 104 in response to receiving an indication that the block having the PBA to which the LBA was previously assigned has failed. For example, controller 130 might assign an LBA1 that was previously assigned to PBA1 to PBA2 of another block (e.g., a spare block) in response to receiving an indication that the block having PBA1 has failed. Further, in response to receiving an indication that the block having PBA2 has failed, controller 130 might update address table 150 by assigning LBA1 to PBA3, the physical block address of another block. For some embodiments, controller 130 might store an indication in table 150 that a PBA corresponds a physical block has failed.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A short-checking method, comprising:
coupling a data line to an activated memory cell;
allowing the data line to float while coupled to the activated memory cell;
sensing a voltage on the data line after a certain time; and
determining whether a short exists in response to the sensed voltage.

2. The method of claim 1, wherein determining whether a short exists comprises determining whether a short exists between a semiconductor and an access line that supplies a voltage that activates the memory cell.

3. The method of claim 1, wherein the short-checking method is performed during an erase operation and/or during a test mode.

4. The method of claim 1, wherein the short-checking method is performed in response to a command that addresses a block that comprises the memory cell.

5. A short-checking method, comprising:
coupling a data line to an activated string of memory cells that is isolated from a source;
isolating the data line from circuitry other than the activated string of memory cells while the data line is coupled to the activated string of memory cells;
coupling the data line to a sense amplifier after a certain time to sense a voltage on the data line; and
determining whether a short exists in response to the sensed voltage.

6. The method of claim 5, wherein a deactivated select transistor between the activated string of memory cells and the source isolates the activated string of memory cells from the source.

7. The method of claim 6, wherein the deactivated select transistor between the activated string of memory cells and the source isolates the data line from the source.

8. The method of claim 5, wherein coupling the data line to the string of activated memory cells comprises activating a select transistor between the data line and the string of activated memory cells.

9. The method of claim 5, wherein isolating the data line from circuitry other than the string of activated memory cells comprises deactivating a transistor between the data line and the sense amplifier and charging circuitry wherein coupling the data line to the sense amplifier comprises activating the transistor.

10. The method of claim 5, further comprising charging the data line before isolating the data line from the circuitry other than the activated string of memory cells.

11. The method of claim 5, wherein the string of memory cells is a vertical string of memory cells.

12. The method of claim 5, wherein the short-checking method is performed in response to a command that addresses a block that comprises the string of memory cells.

13. A memory device, comprising:
a controller;
wherein the controller is configured to cause a data line to be coupled to an activated memory cell;
wherein the controller is configured to cause the data line to float while coupled to the activated memory cell;
wherein the controller is configured to cause a voltage on the data line to be sensed after the data line floats for a certain time; and
wherein the controller is configured to determine whether a short exists in response to the sensed voltage.

14. The memory device of claim 13, further a comprising a status register configured to store an indication of whether the short exists.

15. The memory device of claim 14, wherein status register configured to be read by a memory controller coupled to the memory device.

16. An electronic system, comprising:
a controller;
an integrated circuit device coupled to the controller;
wherein the integrated circuit device is configured to couple a data line to an activated string of memory cells that is isolated from a source;
wherein the integrated circuit device is configured to isolate the data line from circuitry other than the activated string of memory cells while the data line is coupled to the activated string of memory cells;
wherein the integrated circuit device is configured to couple the data line to a sense amplifier after the data line is isolated from the circuitry other than the activated string of memory cells for a certain time to sense a voltage on the data line; and
wherein the integrated circuit device is configured to determine whether a short exists in response to the sensed voltage.

17. The electronic system of claim 16, wherein the controller is configured to add a block containing the string of memory cells to a list of failed blocks in response to receiving an indication from the integrated circuit device that a short exists.

18. The electronic system of claim 16, wherein the controller is configured to assign a logical block address to a physical block that contains the string of memory cells.

19. The electronic system of claim 18, wherein the controller is configured to assign the logical block address to a different physical block in response to receiving an indication from the integrated circuit device that a short exists.

20. The electronic system of claim 16, wherein the integrated circuit device is one of a plurality of integrated circuit devices coupled to the controller.

21. The electronic system of claim 16, wherein the integrated circuit device being configured to isolate the data line from circuitry other than the activated string of memory cells comprises the integrated circuit device being configured to deactivate a transistor between the data line and the sense amplifier and charging circuitry and wherein the integrated circuit device being configured to couple the data line to the sense amplifier comprises the integrated circuit device being configured to activate the transistor.

22. The electronic system of claim 16, wherein the integrated circuit device being configured to couple the data line to the activated string of memory cells comprises the integrated circuit device being configured to activate a select transistor between the string of memory cells and the data line.

23. The electronic system of claim 16, wherein the controller is configured to read a status register on the integrated circuit device configured to store an indication of whether the short exists.

* * * * *